United States Patent

Kesel et al.

Patent Number: 5,574,690
Date of Patent: Nov. 12, 1996

[54] SELF-TEST DEVICE FOR MEMORIES, DECODERS, ETC.

[75] Inventors: Frank Kesel, Pfullingen; Eberhard Boehl, Reutlingen, both of Germany

[73] Assignee: Robert Bosch GmbH, Stuttgart, Germany

[21] Appl. No.: 374,672
[22] PCT Filed: May 6, 1994
[86] PCT No.: PCT/DE94/00521
  § 371 Date: Jan. 20, 1995
  § 102(e) Date: Jan. 20, 1995
[87] PCT Pub. No.: WO94/28555
  PCT Pub. Date: Dec. 8, 1994

[30] Foreign Application Priority Data

May 22, 1993 [DE] Germany ............ 43 17 175.3

[51] Int. Cl.⁶ ............................................. G11C 29/00
[52] U.S. Cl. ................................. 365/201; 371/21.4
[58] Field of Search .................... 365/201; 371/21.3, 371/21.4, 22.4, 41

[56] References Cited

U.S. PATENT DOCUMENTS 3,712,537  1/1973  Carita ........................................ 371/21.4

FOREIGN PATENT DOCUMENTS 0 162 418  11/1985  European Pat. Off. .

OTHER PUBLICATIONS

Heinz Peter Holzapfel, "Fehlertolerante VLSI-Prozessoren", Lehrstuhl für Integrierte Schaltungen der Technischen Universität München, Jun. 24, 1986, pp. 50–73.

P. Mazumder, "Design of a Fault–Tolerant Dram With New On–Chip ECC", *Defect and Fault Tolerance in VLSI Systems*, vol. 1, p. 85–92.

John Wakerly, "Error Detecting Codes, Self–Checking Circuits and Applications", *Computer Design and Architecture Series*, vol. 1, pp. 85–92.

M. Nicolaidis, "Efficient Ubist Implementation for Microprocessor Sequencing Parts", Reliable Integrated Systems Group, IMAG/TIM3, 46 avenue Felix Viallet, 38031 Grenoble Cedex, France, pp. 7–8.

R. Dekker et al., "A Realistic Fault Model and Test Algorithms for Static Random Access Memories", *IEEE Transactions on Computer–Aided Design*, vol. 9, No. 6, Jun. 1990, pp. 567–572.

*Primary Examiner*—Joseph A. Popek
*Attorney, Agent, or Firm*—Keynon & Kenyon

[57] ABSTRACT

A self-test device for memory arrangements, decoders or the like for use during on-line operation, the word lines and/or the column lines of a memory matrix being connected to a check matrix. An error detector which generates an error signal if more than one line is activated simultaneously is connected to the check matrix. Since multiple word lines or column lines are activated in the decoder for most errors which occur, a simple self-test can be performed during on-line operation by this check matrix which can be implemented in a relatively simple and cost-effective manner.

20 Claims, 6 Drawing Sheets

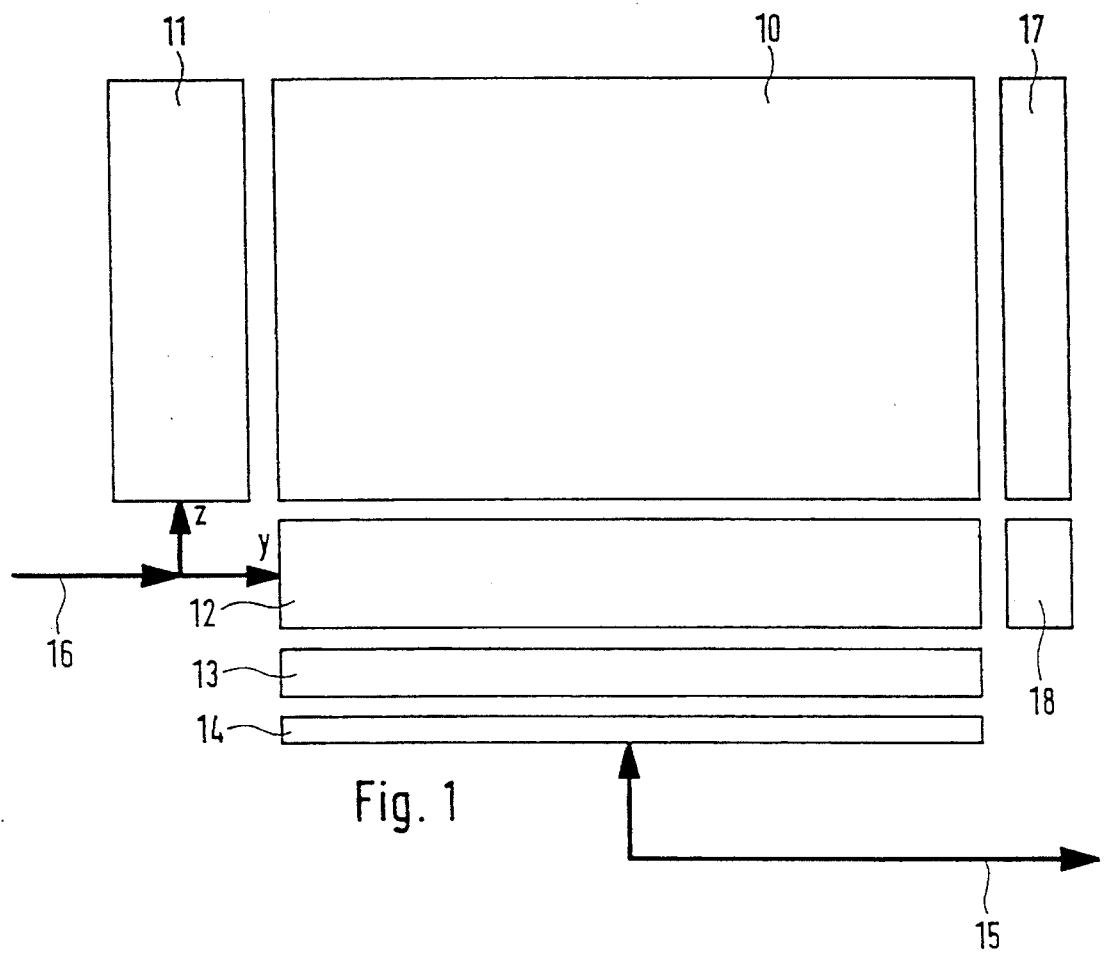
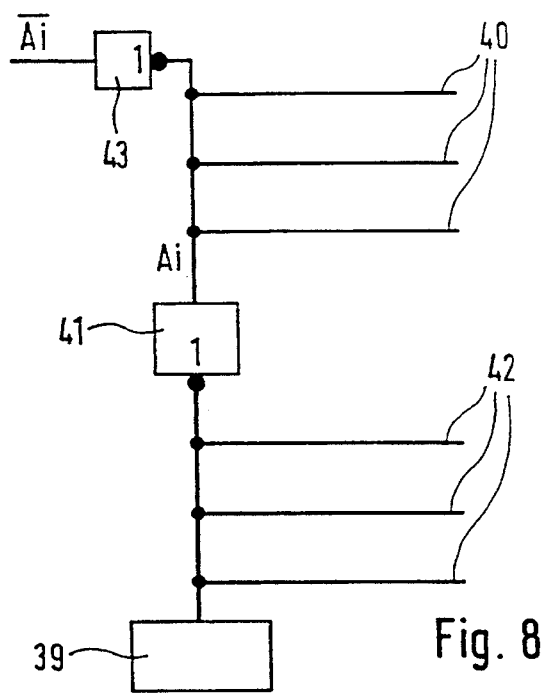

SELF-TEST DEVICE FOR MEMORIES, DECODERS, ETC.

FIELD OF THE INVENTION

1. Prior Art

The present invention relate to a self-test device for memory arrangements, decoders or the like for use during on-line operation, means for checking a plurality of word lines being provided.

2. Background Information

IEEE Trans. on Computer-Aided Design, Vol. 9, No. 6, June 1990, pp. 567–572, "A Realistic Fault Model and Test Algorithms for Static Random Access Memories," discusses techniques for off-line testing of memory arrangements which are known. These techniques can also be used to some extent as a "built-in self-test"; however, due to the numerous required test patterns and the destruction of the memory content, they can be used only conditionally for testing during routine operation ("quasi on-line"). Furthermore, the required test length prohibits their use in the on-line test.

In addition, "Defect and Fault Tolerance in VLSI Systems," in Koren, Plenum Press, New York, 1989 (Design of Fault-Tolerant DRAM with new on Chip ECC—Mazumber, P.), discusses arrangements having coding of data which are known in which different codes are used. However, a coding of this sort prevents only a very small share of the possible hardware errors in the memory arrangement to be checked.

Finally, there are techniques in which the actual selected memory cell is determined via a ROM and its address is compared with the desired address.

In particular, row and column addresses are read out and compared with the input address in a self-checking checker. Techniques of this sort are known, for example, from "Self-checking Flash-EPROM," M. Nicolaidis, contribution to the JESSI SE 11 project, presentation in the lecture on Sep. 16, 1992 in Grenoble (France), or from "Efficient ubist implementation for microprocessor sequencing parts," M. Nicolaidis, June 1990, publication of the Institute IMAG/TIM 3, 46 Avenue Félix Viallet, 38031 Grenoble (France). However, these self-test devices are very expensive in terms of circuit technology and cover on their own only the decoder errors.

Overall, the known self-test devices and techniques either respectively cover on their own only very few possible errors, or are very expensive with regard to the necessary hardware, or are very time-consuming such that they are not suitable for on-line operation.

SUMMARY OF THE INVENTION

The self-test device according to the present invention has, in contrast, the advantage that, for monitoring the word lines, only a 1-out-of-n checker is used which, during on-line operation, delivers an error message via an error detector if more than one word line is active simultaneously. As a result, most error sources in the decoder are detected, and this self-test can be performed at a very low cost and at high speed. Practically all addressing errors can be detected, provided that it is ensured, through the coding of the address with a suitable code in conjunction with constructive design features (miles) and a code check, that a single error does not influence two word lines in the opposite direction. Also, it can be ensured through the choice of the data code that a faulty code is detected if no word line is activated.

In one preferred refinement of the 1-out-of-n checker according to the present invention, each word line in the check matrix is connected respectively to gate terminals (control connections) of z switches of a switching matrix by way of which z test lines, having a first potential (Vdd) applied to them, can be connected either to terminals (connections) at a second potential (Vss) or to a sensor line, which also has the first potential (Vdd) applied to it corresponding to the coding of the re respective word line, the error detector being connected to the sensor line and designed as a current or voltage sensor. If two word lines are simultaneously active, the error detector is connected to the second potential via two switches such that an increased current or rather a change in the potential, can be sensed.

The switches of the switching matrix are expediently designed as FET transistors, and the terminals at a second potential (Vss) are designed as ground terminals.

To increase the reliability of the checking, the check matrix itself is advantageously checked by a checking device which tests the functioning of the switches in the switching matrix. All switches are sequentially checked, respectively, at larger intervals.

In one advantageous refinement of this checking device, the test lines in the checking device are connected to tristate drivers by way of which in each case the test line connected to the switches to be checked and triggered for this purpose can be connected either to the second potential (Vss) or to the sensor line corresponding to the switch coding. In this manner, the functionality of all the switches can be tested one after another.

In addition, means for checking supply lines which are arranged in parallel to the word lines and carry the first (Vdd) and/or the second potential (Vss) can be provided even more expediently. The checking of the supply lines having the second potential applied to them can take place similarly to the checking of the switches by the checking device. To check the supply lines having the first potential (Vdd) applied to them, additional switches are provided for controllable connection of the supply lines carrying this first potential to the sensor line, these switches being controllable by the word lines and/or by additional control lines. Here, following the discharging of the sensor line by the checking of the supply lines carrying the second potential for high-impedance output drivers of the checking device, the recharging of the sensor line following the turning-on of the additional switches is checked.

If the self-test device is used with memory arrangements such as RAM or ROM memories, then it is fitting to use a first check matrix for the row lines and a second check matrix for the column lines.

Using the 1-out-of-n checker according to the present invention, addressing errors can be detected which lead to the activation of multiple word lines. Incorrectly applied addresses and word lines/column decoder lines reversed by a single defect cannot be detected in this process. In order to also detect these possible errors, the input addresses are coded and a code checker is provided for the purpose of checking. If the inverted and the non-inverted value of an address bit were to change due to a single defect, the code checker and the 1-out-of-n checker could not detect this. In order to record this possible error also, the non-inverted lines branching off from the individual address lines and the lines branching off and inverted by an inverter are set apart from one another without common branch points. In this manner, it is practically excluded that simultaneous interruptions of two lines arise through a defect. The 1-out-of-n checker can then detect a line interruption of this sort. If all gases connected to these lines have the same input threshold value, i.e., if all of these gates, including the code checker, toggle their output level at the same voltage level, then short-circuits between two lines can also be detected. Since it is not always possible to meet thins requirement dimensioning specifications are given for the input inverters of the address lines, for the decoder gates and for the code checker by way of which an error is detected either in the code checker or in the 1-out-of-n checker for short-circuits between inverted and non-inverted address lines.

Even greater reliability can be achieved by connecting both inverters to a current monitoring device. Short-circuits can then be detected directly via an increased current through the current monitoring device.

An even more advantageous solution is that from each address line the non-inverted lines first branch off, set apart from one another and without a common branch point, the inverter for the inverted lines which branch off is connected into the address line, and the inverted lines branch off from the inverted area of the address line set apart from one another and without common branch points. Using these tighter design rules, it is possible to use, instead of the 1-out-of-n checker, a simpler neighbor checker which checks only whether two word lines which are assigned neighboring addresses are active simultaneously. A neighbor checker of this sort is known, for example, from "Error Detecting Codes, Self-checking Circles and Applications," J. Wakerly, Elsevier, North-Holland, 1978.

BRIEF DESCRIPTION OF THE DRAWINGS

FIG. 1 shows a block diagram of a memory arrangement having a row decoder and a column decoder.

FIG. 8 shows a further exemplary embodiment of a geometric arrangement of inverted and non-inverted lines branching off from a single address line.

DETAILED DESCRIPTION OF THE INVENTION

Figure 2:
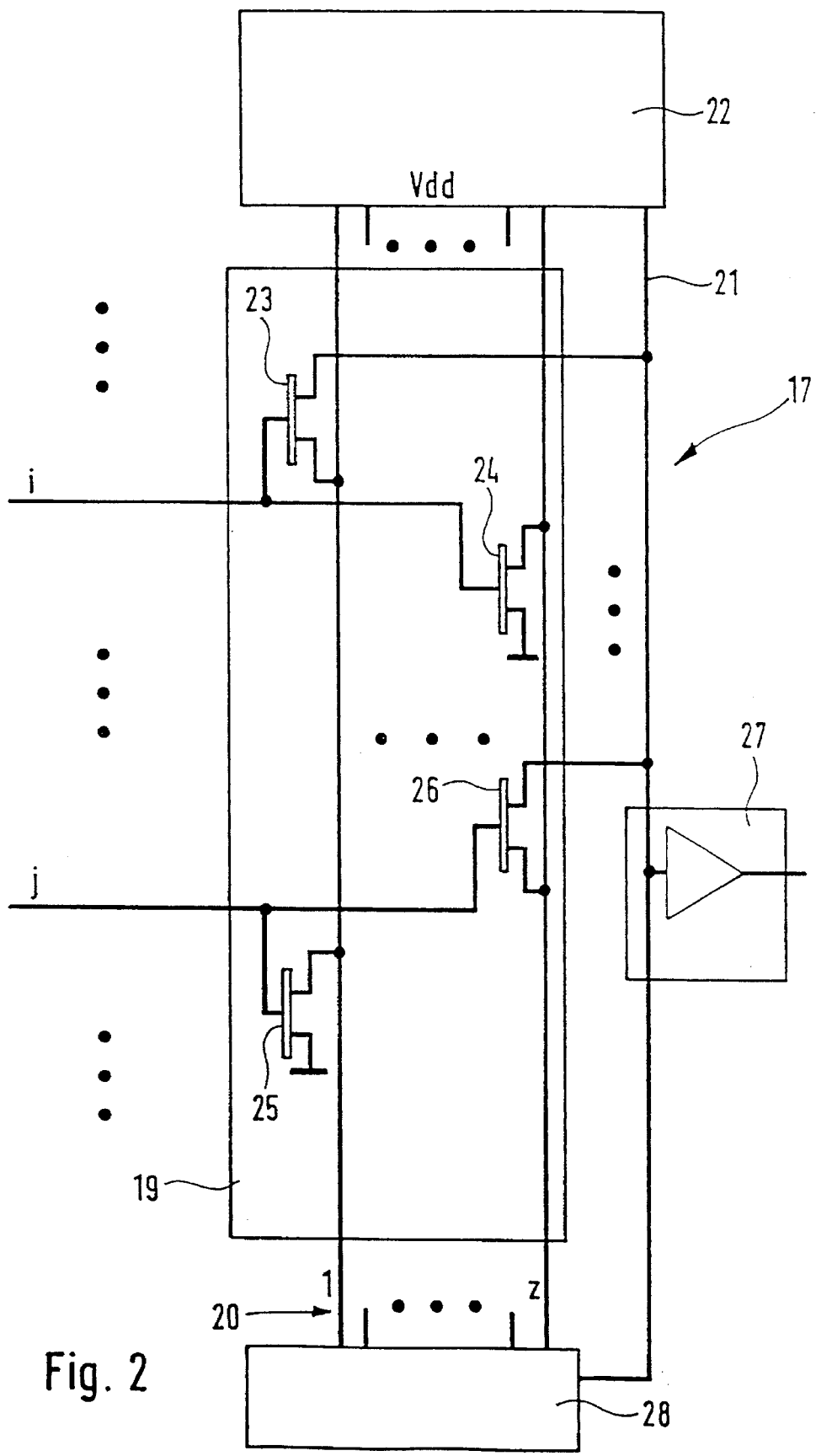
FIG. 2 shows depiction of a 1-out-of-n checker.

The memory arrangement shown in FIG. 1 could be a RAM memory, for example, and consists in a manner known per se of a memory matrix 10, a row decoder 11 connected thereto and a comparably connected column decoder 12. The column decoder is connected via a memory sense amplifier 13 and a signature checker 14 to a data bus 15 for inputting (reading in) and outputting (reading out) data. An address bus 16 of width y+z bits, of which z bits are used for word line selection and y bits for column selection, is connected to the row decoder 11 and the column decoder 12 in order to be able to select $n=2^z$ row addresses and $p=2^y$ column addresses. Thus, the row decoder 11 is connected to the memory matrix 10 in a manner not further described via n row or rather word lines and the column decoder 12 via m×p (m=bit width of the data word) column lines. A 1-out-of-n checker 17 is assigned to the n word lines of the memory matrix 10 and a corresponding 1-out-of-p checker is assigned to the p column lines which are generated in the column decoder 12.

The 1-out-of-n checker 17 is shown in greater detail in FIG. 2. For the sake of simplicity, only the two word lines i and j are shown out of the n row lines or rather word lines. The word lines extend in parallel into a switching matrix 19, in which z test lines 20 run perpendicularly to the n word lines. Outside of the switching matrix 19, another sensor line 21 runs in parallel to the test lines 20. The test lines 20 and the sensor line 21 have a first potential Vdd applied to them by a precharging device 22. Each word line is coded differently by FET transistors, it being possible for the coding to correspond to the address bits of the respective word line in special cases. Each word line triggers for this purpose z of these FET transistors in parallel; the transistors are connected to the z test lines 20. For coding purposes, the respective FET transistor connects the test line either to the sensor line 21 or to a terminal at a low potential Vss; this is the ground terminal in the exemplary embodiment.

In the exemplary embodiment shown, the coding of the word line i has, for example, a 1 at the start and a 0 at the end. Thus, the corresponding first FET transistor 23 assigned to the first test line connects this first test line 20 to the sensor line 21, whereas the last, i.e., the z-th FET transistor 24 connects the z test line to ground With the word line j, the reverse holds: there, the first FET transistor 25 connects the first test line to ground and the last FET transistor 26 connects the z test line to the sensor line 21.

The sensor line 21 is connected to a current sensor 27 which senses indirectly, through a change in the potential on the sensor line 21, whether a current is flowing via the test lines 20 to the lower potential Vss (ground in the exemplary embodiment). Moreover, a checking device 28 is connected to the z test lines 20 and the sensor line 21 which is described in greater detail in conjunction with FIG. 3.

Since each word line is coded differently in the switching matrix 19, the sensor line 21, which is precharged to the potential Vdd, becomes discharged if more than one word line is active. If, for example, both word lines i and j are active, then a discharging of the sensor line 21 takes place via the transistors 23 and 25 and also via the transistors 24 and 26. Since each word line is coded differently, one transistor combination inevitably arises which brings about this discharging for two active word lines. Due to the discharging, a current is detected by the current sensor 27 and an error message is output in a manner not considered in further detail. This error message indicates to the user that an error has occurred.

To check the column address, the comparably designed 1-out-of-p checker 18 is used; the difference is that instead of n (triggered) word lines, p column lines are now checked.

Figure 3:
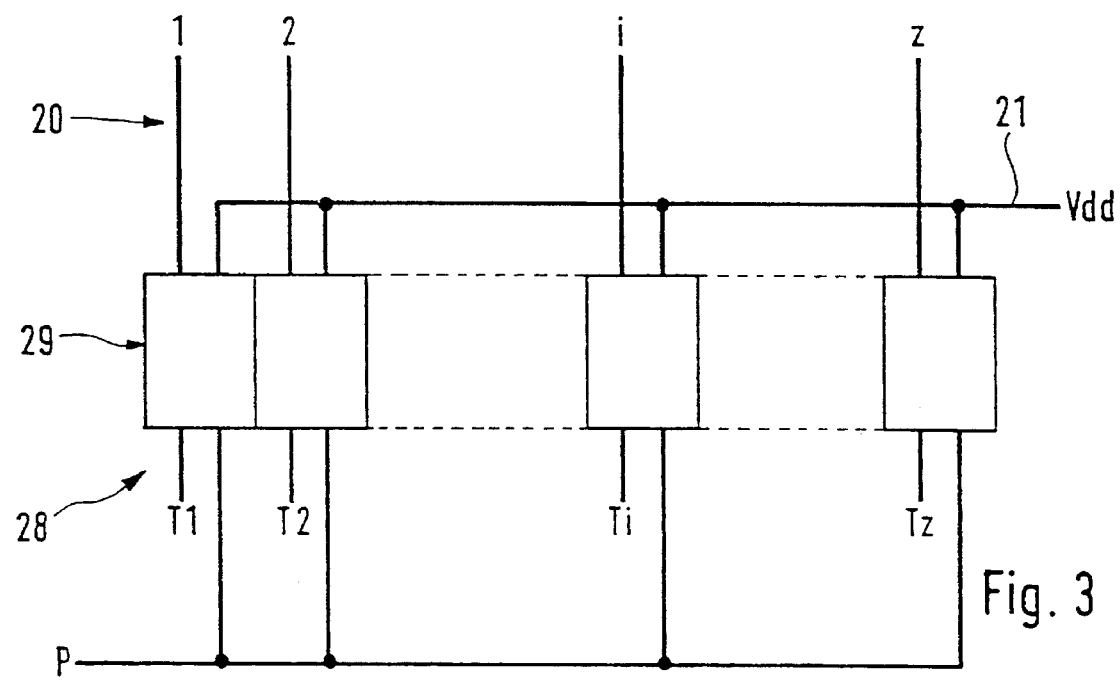
FIG. 3 shows a schematic depiction of a checking device for the 1-out-of-n checker.

In FIG. 3, the checking device 28 is illustrated in greater detail. Essentially, it consists of z tristate drivers 29, each tri-state driver being connected to one of the test lines 20. Moreover, the sensor line 21 having the potential Vdd applied to it is connected to all tristate drivers 29. On the control side, all tristate drivers 29 have a common check signal P as well as individual check signals T1 to Tz applied to them.

Using this checking device 28, the functionality of each of the FET transistors 23–26 in the switching matrix 19 is checked one after another, this test being executable both after a read/write access for the addressed word line (single columns or all one after another) or completely in longer time intervals during an interruption in the operation of the memory arrangement.

The checking of the transistors 23,26 connected to the sensor line 21 will be explained using the example of transistor 23. First, test signals P and T1 are generated by way of which the first test line connected to the transistor 23 is connected to the low potential Vss. Then, a control signal is applied to the word line i. If the transistor 23 functions properly, it pulls the potential of the sensor line 21 to Vss in this process so that the current sensor 27 is triggered. Here, this triggering acts as a confirmation signal for the proper functioning of this transistor 23.

The checking of the transistors 24,25 connected to ground will be explained using the example of transistor 24. By way of corresponding check signals P and Tz, the z test line is connected to the sensor line 21. If a signal is now applied to the word line i, the transistor 24, again assuming it is functioning properly, pulls the potential of the sensor line 21 to Vss so that the current sensor 27 is triggered. In this manner, all transistors can be checked one after another. The necessary check signals P and T, as well as the corresponding signals on the word lines, are generated by a signal sequence controller, not shown, or rather by a microcomputer, not shown. The entire 1-out-of-n checker is tested using n×z check steps. The checking of the 1-out-of-p checker 18 can be handled in parallel.

Figure 4:
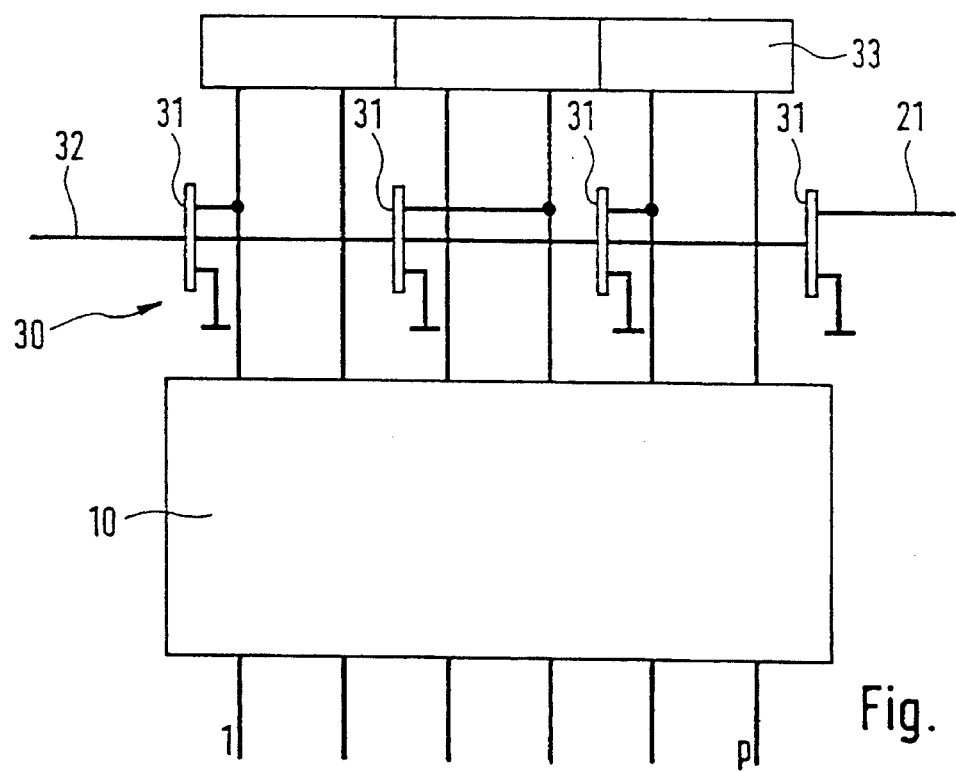
FIG. 4 shows a circuit diagram of a ROM row for checking a precharge line, the read amplifier (memory sense amplifier) and the read signals of the memory arrangement.

A ROM row 30 shown in FIG. 4 can be used additionally during interruptions in the operation to check the precharge line for the memory matrix 10, the memory sense amplifiers 13, the read signals and the inactivity of the write signals. In the exemplary embodiment, only a single ROM row 30 is shown Which consists of four FET transistors 31 which can be triggered via a common control line 32. Out of the six column lines shown, three can be connected—via three of the FET transistors 31—to ground, whereas the sensor line 21 can be connected to ground by way of the fourth FET transistor 31. The p column lines (six of which are shown) are precharged to the potential Vdd by a precharging device 33. Three of the column lines are pulled down to the potential Vss by a signal on the control line 32. In this process, a different data word is activated in each column by this ROM row 30 in order to test the proper triggering of the column decoder and the correct functioning of the memory sense amplifier as will as the output stages. Naturally, several such ROM rows having different coding can also be provided, the data words specified by these ROM rows not necessarily having to be code words for the case where the data are stored in the memory in an encoded state. Besides individual checking of a column, it is also possible to read out all ROM data words one after another in a fixed order and to compare a signature formed therefrom with a stored desired signature. This takes place in the signature checker 14 shown in FIG. 1.

Normally, the Vdd and Vss supply lines in the memory matrix 10 are run in parallel to the bit lines (columns). By way of constructive design features and the bit allocation of the matrix, it is to be assured that the same supply lines are not used for multiple bits of the same data word. This decoupling is to be carried on consistently all the way to the output stages of the memory arrangement. Common-mode errors due to influences of the supply voltage lines in the matrix are avoided in this manner. A column-by-column supply is assumed, and the column decoder 12 selects the data bits for each bit location in the same sequence.

Figure 5:
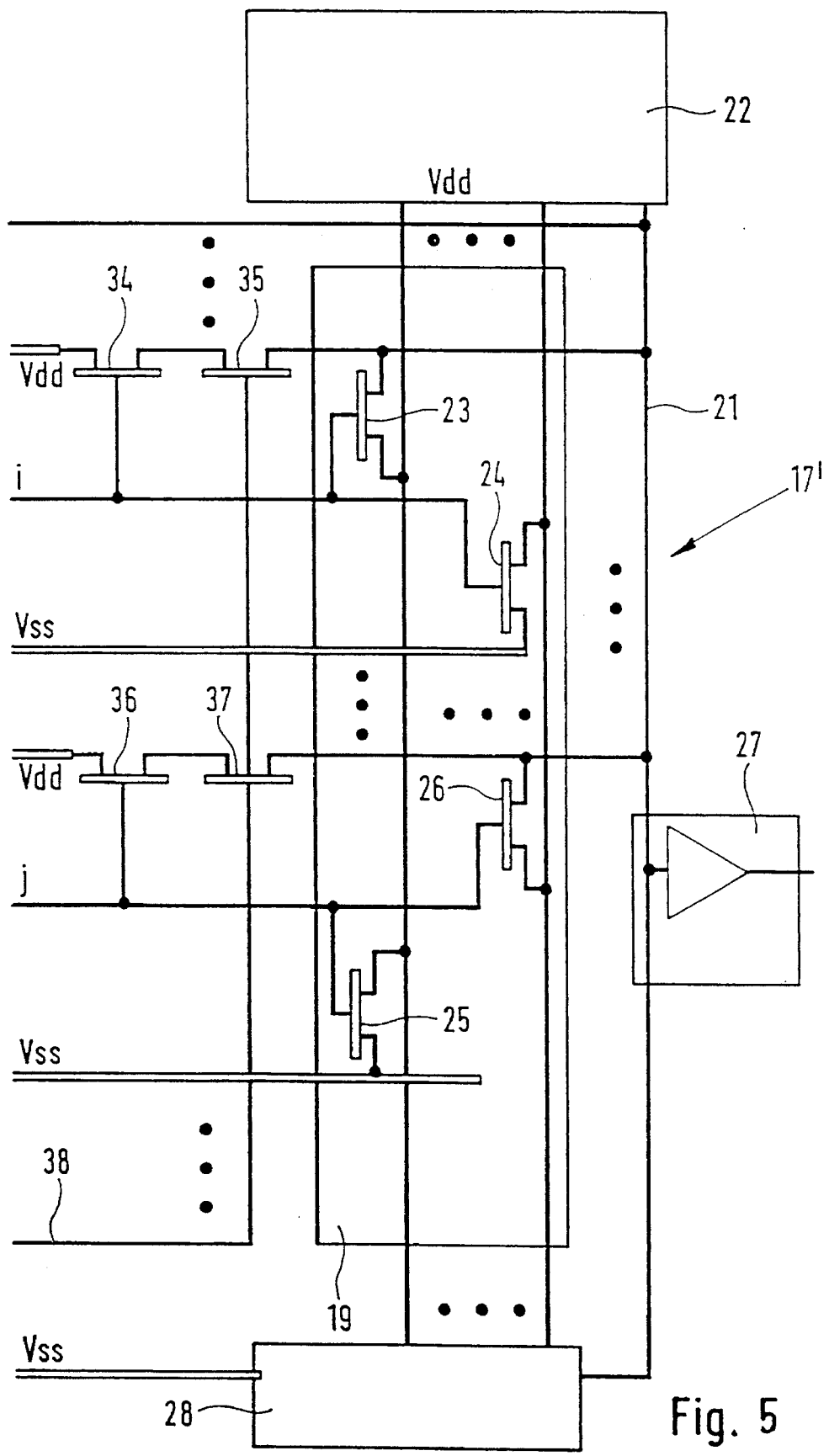
FIG. 5 shows a modified 1-out-of-n checker for additional checking of supply lines arranged in parallel to the word lines.

If, in the special case, supply lines are to be run in parallel to the word lines, then checking by way of the circuit shown in FIG. 5 becomes possible. This circuit corresponds for the most part to the one shown in FIG. 2; components which are identical or which have an identical effect are provide with the same reference numbers and are not described again. A modified 1-out-of-n checker 17' is the result. In contrast to FIG. 2, two Vss lines as well as two Vdd lines are now run in parallel to the word lines i and j (and, also in parallel to the remaining word lines not depicted). Moreover, a Vss lines is run to the checking device 28. Each Vdd line is connected to the sensor line 21 via the series connection of the switching (connection) paths of two FET transistors 34,35 or rather 36,37. The FET transistors 34,36 are controlled by the word lines i or rather j and the FET transistors 35,37 are controlled jointly by a control line 38.

In addition to the checking of the word lines according to FIG. 2, a check of the Vdd or Vss lines is also possible. The Vss lines are also checked all the way up to a branch point if the checking device 28 is activated following error-free word selection. This takes place during the checking of the transistors 24 and 25. If the branch point is at the start of the memory matrix 10, then the entire row is also checked for interruption of the Vss or rather ground line. Since there is no transistor on the ground line for the word line with the address "1111 . . . 1", this word line can also be checked by connecting it to the ground terminal of the checking device 28, i.e., the ground terminal of the tristate drivers. In addition, the Vdd lines can also be tested. For this purpose, in each case after the Vss test (discharged sensor line 21) for high-impedance tristate drivers 29 of the checking device 28, the control line 38 is activated and the recharging of the sensor line 21 via the transistors 34,35 or rather 36,37 (depending on whether the word line i or j is activated) is checked.

The basis for the checking of the memory arrangement, or rather the word lines and the column lines, up until now has been the assumption that one or more word lines, or rather column lines, are additionally activated by an error in the row decoder 11 or column decoder 12. This method cannot detect errors which are based on an incorrectly applied address and on a reversal of word lines/column lines caused by a single defect. To detect errors of this sort, the input address is coded, for example, using a parity bit, a check of this code being handled by a code checker which can, for example, be included in the decoder. In addition, certain geometric precautions should be undertaken in order to prevent the inverted and the non-inverted value of an address bit from changing due to a single error without the code checker of the address being able to note this change. This is achieved using the arrangement shown in FIG. 6.

For the sake of simplicity, only a single address line $\overline{Ai}$ is shown, which forms, via the input inverter 43, the address line Ai which, along with other address lines not shown, is fed to a code checker 39 in order to check the coding of the input address. In this manner, it can be detected if the applied address is incorrect. A non-inverted line 40 and a line 42 which is inverted using an inverter 41 branch off of this address line Ai. These lines then branch off again in a known manner and run to the gates of the row decoder 11 or column decoder 12. The non-inverted line 40 and the line to the inverter 41 are maintained at such a great distance from one another that a (point) defect cannot jointly influence them such that both can take on another potential than the line to the decoder 39, or such that this is at least unlikely. Here, star-shaped branches are ruled out, i.e., these two lines 40,42 are branched off from distinct points which are set apart from one another on the address line Ai.

Figure 10:
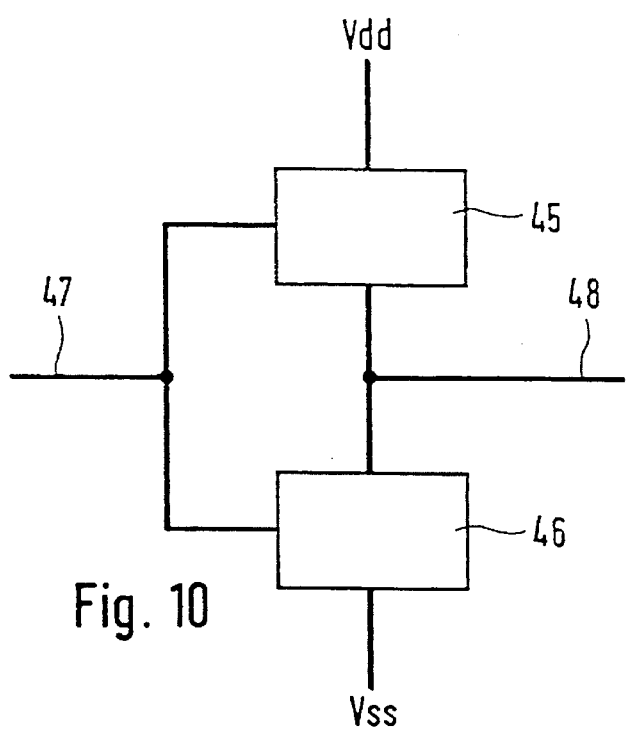
FIG. 10 shows a schematic depiction of a gate implemented using static CMOS technology.

The inverters 41 and 43 and the gates not shown on the branched lines 40 and 42 as well as the code checker 39 are dimensioned such that, for example, if a short-circuit occurs between the lines 40 and 42, all gates not shown which are connected on these lines 40 and 42 and the code checker 39 sense the same logical level if exactly one input signal is not at high (Vdd) or low (Vss) potential. The gates not shown which are connected on the lines 40 and 42 as well as the code checker 39 and the inverters 41 and 43 can be implemented, for example, using conventional static circuit technology with complementary FET transistors according to FIG. 10 (CMOS technology). In this technology, the P-channel branch 45 connects a current between the upper potential Vdd and the output 48 if the relevant inputs—here, only an input 47 is shown—are at low potential (Vss). In contrast, the N-channel branch 46 carries a current between the output 48 and the low potential (Vss) if the relevant inputs—here, shown as input 47—have a high potential (Vdd).

If all gates directly connected to the lines 40 and 42, i.e., the gates not shown and the gates in the code checker, are implemented, for example, such that only a single path exists in the N-channel branch 46 from the output 48 to the low potential Vss and this path is dimensioned by the size of the transistors such that upon charge reversal of the output 48 from the high potential Vdd, more current flows than upon charge reversal of the output 48 from the low potential Vss through exactly one arbitrary path in the P-channel branch 45 for other input condition 47, then the condition must hold for the inverters 41 and 43 that the transistors in the P-channel branch 45 supply more current at the start of the charge reversal of the output 48 from the low potential Vss than the transistors in the N-channel branch 46 at the start of the charge reversal of the output 48 from the high potential Vdd. This condition is to be implemented similarly for all inverters 41 and 43 with all address bits Ai, just as the same dimensioning specification must hold for all gates not shown on the lines 40 and 42 as well as the code checker 39 for all address bits Ai.

Figure 6:
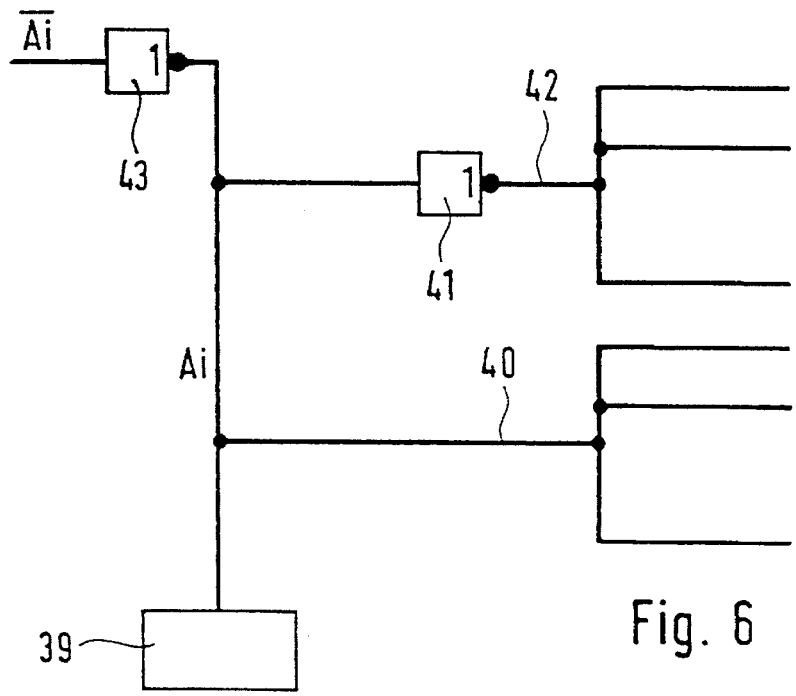
FIG. 6 shows a geometric arrangement of non-inverted and inverted lines branching off from an address line.

Using the arrangement shown in FIG. 6, it is ensured that in general, only one line can be disconnected by a point defect or short-circuited in the described manner such that as a result of this error, more than one word line or no word line is activated which again can be detected by the 1-out-of-p checker 17, 17'.

Figure 7:
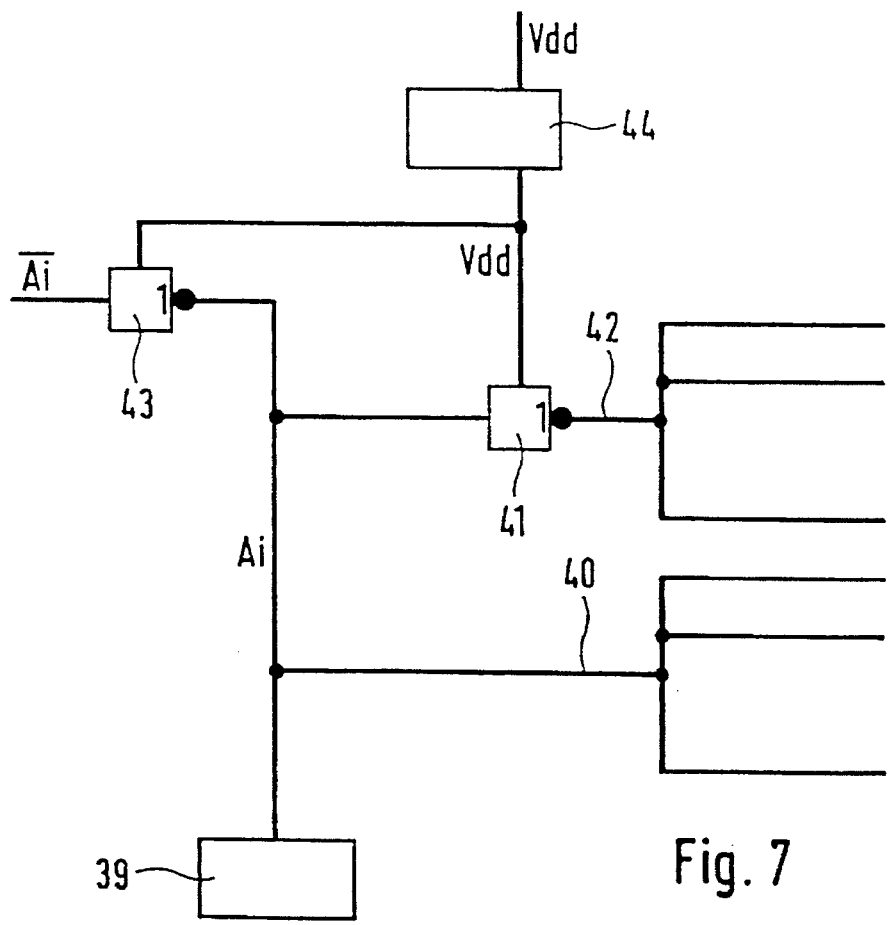
FIG. 7 shows a geometric arrangement of non-inverted and inverted lines branching off from an address line having an additional current monitoring device.

Using the arrangement shown in FIG. 7, short-circuits between the lines car be detected with even greater reliability. Both inverters 41,43 are connected to a current sensor 44. If a short-circuit now occurs between an inverted line 42 and a non-inverted line 40, the current sensor 44 senses an increased current draw by the inverters 41,43 since they operate against one another on the output side. This increased current value which is sensed then leads to an error message. The current sensor can be assigned to the line to the upper potential (Vdd) or to the lower potential (Vss).

FIG. 8 shows another alternative geometric configuration. Here, the inverter 41 is connected into the address line Ai, this being between multiple branches of non-inverted lines 40 and multiple branches of inverted lines 42. Both the inverted lines 42 as well as the non-inverted lines 40 are set apart among one another and have in each case their own branch points from the address line Ai which are also set apart from one another. The gates not shown which are connected to the lines 40 and 42 and the directly connected gates of the code checker 39 on the one hand and the inverters 41 and 43 on the other hand are dimensioned for all address lines Ai as described for the circuit in FIG. 6. If these geometric rules are met, assuming single defects of a limited size, then either one word line/column line will become additionally active of which the address will differ by exactly 1 bit from the desired address, or no word line/column line will become active. Both are detected by the 1-out-of-n checker 17, 17' or rather the 1-out-of-p checker 18. Since only word lines/column lines which are contiguous in terms of address can become active, then, instead of a 1-out-of-n checker, a simpler neighbor checker can also be used, this neighbor checker being as described in the prior art specified in the introduction ("Error Detecting Codes"). Interruptions of the word line or the precharge line are also detected. The neighbor checker not only requires less circuit engineering expense than the 1-out-of-n checker, but the required test expense for the power-on test is also significantly lower, the power-on test being necessary to verify the initial error-free operation.

Figure 9:
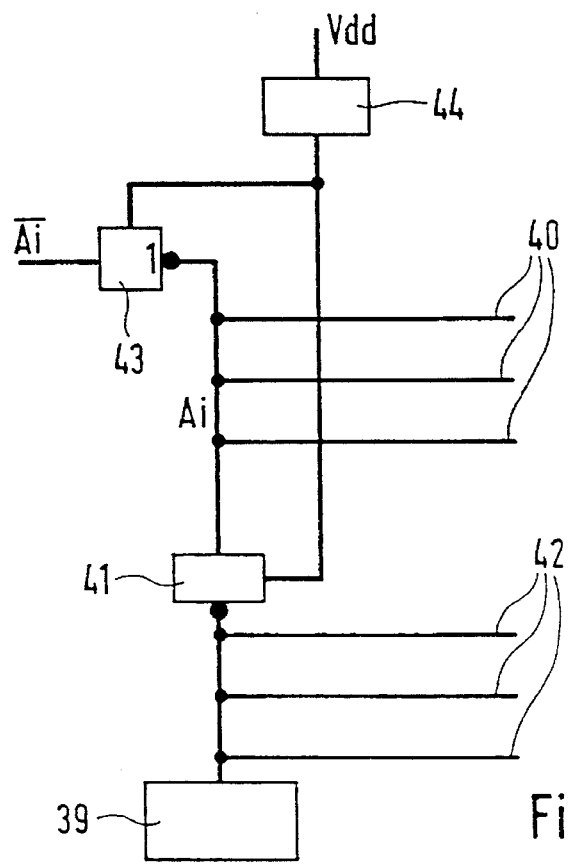
FIG. 9 shows a further exemplary embodiment of a geometric arrangement of inverted and non-inverted lines branching off from a single address line having an additional current monitoring device.

In FIG. 9, the corresponding circuit is shown with the current sensor 44, similar to FIG. 7.

The described self-test device requires for coding with one parity bit only an additional overall expense in terms of chip area of approx. 15%. Of this, 12.5% is allotted to the coding (8-bit data word and one parity bit) for the 1-out-of-n checker for four kbyte RAM with 256 rows and 128 columns (+16 columns of parity bits, +8 columns of checker ROM), for a row-to-area ratio RAM: ROM=10 additionally approx. 0.6%.

Added to this are test hardware and the controller with an additional approx. 1%, while the expense for the column checker, the row ROM, the additional hardware and the controller amounts to a total of approx. 0.8%. In contrast, the usage of two code bits would already mean an additional expense of 25%, the error coverage being considerably worse without the additional measures described according to the invention.

It should also be noted that the described self-test device can naturally also be used for a wide variety of memory arrangements such as read-write memory (RAM) and read-only memory (ROM, EPROM and the like). Moreover, this self-test device can also be used alone for decoders.

What is claimed is:

1. A self-test device for checking a plurality of lines, comprising:
    at least one check matrix coupled to the plurality of lines and including at least one 1-out-of-n checker, the 1-out-of-n checker including at least one sensor line; and
    at least one error detector coupled to the check matrix, the error detector generating an error signal when at least two of the plurality of lines are activated simultaneously.

2. The self-test device according to claim 1, wherein the 1-out-of-n checker further includes at least one test line in parallel with the sensor line, at least one switching matrix, the switching matrix including a plurality of first switches, each first switch having a first control gate terminal and a plurality of first terminals, each first control gate terminal coupled to a respective one of the plurality of lines, at least one of the plurality of first terminals coupled to a test line, the test line having a first potential (Vdd), and at least one of the plurality of first terminals further coupled to at least one of a second potential (Vss) and the sensor line, the sensor line having the first potential (Vdd).

3. The self-test device according to claim 2, wherein the plurality of first switches are FET transistors.

4. The self-test device according to claim 2, wherein the second potential (Vss) is ground.

5. The self-test device according to claim 2, wherein the 1-out-of-n checker further includes at least one checking device, the checking device coupled to the test line and to the sensor line, the checking device checking a functioning of the plurality of first switches of the switching matrix.

6. The self-test device according to claim 5, wherein the plurality of first switches of the switching matrix are checked sequentially.

7. The self-test device according to claim 5, wherein the checking device includes at least one tri-state driver, the tri-state driver coupled to the test line and to at least one of the second potential (Vss) and the sensor line.

8. The self-test device according to claim 5, wherein the 1-out-of-n checker further includes a plurality of supply lines and at least one supply line checker, the plurality of supply lines being in parallel with the plurality of lines, the plurality of supply lines having at least one of the first potential (Vdd) and the second potential (Vss), the supply line checker being coupled to the plurality of supply lines.

9. The self-test device according to claim 8, wherein the supply line checker includes a plurality of second switches, each second switch having a second control gate terminal and a plurality of second terminals, each second control gate terminal coupled to a respective one of the plurality of lines, the plurality of second terminals further coupled to the plurality of supply lines, the plurality of supply lines having the first potential (Vdd).

10. A self-test device for checking a plurality of lines, comprising:
at least one check matrix coupled to the plurality of lines, the plurality of lines including at least one of row lines and column lines;
at least one error detector coupled to the check matrix, the error detector generating an error signal when at least two of the plurality of lines are activated simultaneously; and
a plurality of address lines for transporting coded input addresses, at least one code checker, and at least one inverter, the plurality of address bus lines including at least one first address line carrying a non-inverted signal and at least one second address line carrying an inverted signal, the address lines being coupled to the code checker, to the inverter, and to the plurality of lines, the plurality of address lines being set apart from one another without common branch points, the error detector generating the error signal when at least two of the plurality of lines assigned to neighboring addresses are activated simultaneously.

11. The self-test device according to claim 10, further comprising at least one memory matrix, the memory matrix coupled to the check matrix, the check matrix including at least one row check matrix for checking row lines and at least one column check matrix for checking column lines, the row check matrix being coupled to the memory matrix and the column check matrix being coupled to the memory matrix.

12. The self-test device according to claim 11, further comprising at least one memory sense amplifier, a plurality of precharge lines, at least one control line, and at least one ROM row, the ROM row checking at least one of the precharge lines, the memory sense amplifier and read signals during interruptions in a test mode operation, the ROM row being coupled to the at least one of the precharge lines and to the control line.

13. The self-test device according to claim 12, wherein the memory matrix includes one of a read-only memory and a read-write memory.

14. The self-test device according to claim 12, wherein the ROM row includes at least one third switch, the third switch being coupled to the control line.

15. The self-test device according to claim 10, wherein the at least one inverter includes a plurality of inverters, and further comprising at least one current monitoring device, the current monitoring device being coupled to the address lines and to the inverters, each of the address lines being coupled to a respective one of the plurality of inverters.

16. The self-test device according to claim 10, wherein the at least one first address line includes a plurality of first address lines set apart from one another without common branch points, and wherein the at least one second address line includes a plurality of second address lines set apart from one another without common branch points.

17. A self-test device for checking a plurality of lines, comprising:
at least one check matrix coupled to the plurality of lines, the plurality of lines including at least one of row links and column lines;
at least one error detector coupled to the check matrix, the error detector generating an error signal when at least two of the plurality of lines are activated simultaneously;
at least one memory sense amplifier;
plurality of precharge lines;
at least one memory matrix, the memory matrix coupled to the check matrix, the check matrix including at least one row check matrix for checking row lines and at least one column check matrix for checking column lines the row check matrix being coupled to the memory matrix and the column check matrix being coupled to the memory matrix, the memory matrix including one of a read-only memory and a read-write memory, the memory matrix including a plurality of memory cells for storing bits of a memory word, at least one of the precharge lines having a first potential (Vdd) and at least one other of the precharge lines having a second potential (Vss), the plurality of memory cells being coupled to the at least one of the precharge lines and to the at least one other of the precharge lines, outside of the memory matrix;
at least one control line; and
at least one ROM row, the ROM row checking at least one of the precharge lines, the memory sense amplifier and read signals during interruptions in a test mode operation, the ROM row being coupled to the at least one of the precharge lines and to the control line.

18. The self-test device according to claim 17, further comprising means for detecting interruption of the precharge lines within the memory matrix.

19. The self-test device according to claim 10, wherein one of the checkers and the check matrix detects a short-circuit between at least two of the plurality of address lines.

20. The self-test device according to claim 1, wherein the self-test device is one of a memory arrangement and a decoder.

* * * * *